United States Patent [19]
Etters et al.

[11] Patent Number: 6,010,359
[45] Date of Patent: Jan. 4, 2000

[54] ELECTRICAL CONNECTOR SYSTEM FOR SHIELDED FLAT FLEXIBLE CIRCUITRY

[75] Inventors: Harry N. Etters, Plainfield; Robert M. Fuerst, Maple Park; Yves LePottier, Geneva; Russell J. Watt, Chicago, all of Ill.

[73] Assignee: Molex Incorporated, Lisle, Ill.

[21] Appl. No.: 09/112,081

[22] Filed: Jul. 8, 1998

[51] Int. Cl.[7] ................................................... H01R 9/07
[52] U.S. Cl. ............................................. 439/496; 439/67
[58] Field of Search .............................. 439/67, 77, 108, 439/495, 496, 607, 493, 497

[56] References Cited

U.S. PATENT DOCUMENTS

| | | | |
|---|---|---|---|
| 3,602,870 | 8/1971 | Willard | 339/17 |
| 3,825,878 | 7/1974 | Finger et al. | 339/17 F |
| 4,802,866 | 2/1989 | Balzano et al. | 439/496 |
| 5,383,788 | 1/1995 | Spencer | 439/67 |
| 5,529,502 | 6/1996 | Peltier et al. | 439/67 |
| 5,556,300 | 9/1996 | Parker | 439/497 |
| 5,564,948 | 10/1996 | Harting et al. | 439/607 |

FOREIGN PATENT DOCUMENTS

WO 97/29526  8/1997  WIPO ............................. H01R 9/07

*Primary Examiner*—Khiem Nguyen
*Assistant Examiner*—V. Johnson
*Attorney, Agent, or Firm*—Stacey E. Caldwell

[57] ABSTRACT

A connector system for terminating a shielded flat flexible circuit includes a connector body member on which the circuit is positionable. The body member is conductive and includes at least one projection. A flat flexible circuit includes a plurality of signal conductors and at least one grounding conductor. The circuit includes a hole for receiving the projection of the body member in engagement with the grounding conductor to thereby common the grounding conductor with the conductive connector body member.

24 Claims, 7 Drawing Sheets

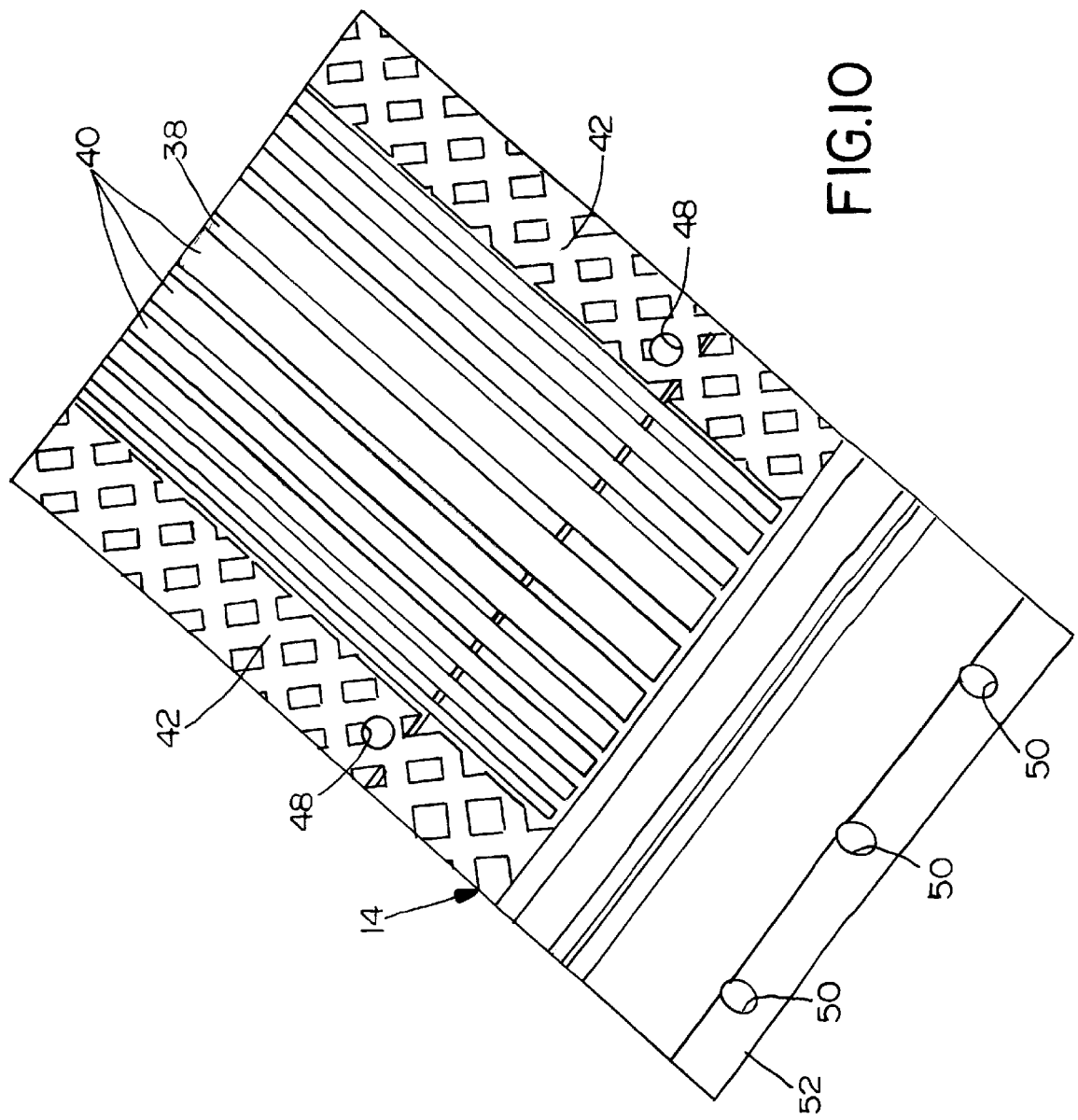

ELECTRICAL CONNECTOR SYSTEM FOR SHIELDED FLAT FLEXIBLE CIRCUITRY

FIELD OF THE INVENTION

This invention generally relates to the art of electrical connectors and, particularly, to connectors for electrically interconnecting the conductors of a shielded flat flexible circuit to the conductors of a complementary mating connecting device.

BACKGROUND OF THE INVENTION

Electrical circuitry often is provided with protection from electromagnetic interference (EMI) and radio frequency interference (RFI) emanating from or entering the system. Although EMI and RFI now are often used interchangeably, EMI has been used to connote energy occurring anywhere in the electromagnetic spectrum and RFI has been limited to interference in the radio communication band. EMI energy can be generated outside as well as inside the system. External EMI energy can interfere with the operation of electronic equipment within the system, while internal EMI energy can create "cross talk" and "noise" which can cause erroneous data transmission.

Electrical connectors are particularly prone to disruptions from EMI energy because of the numerous contact areas and openings for electrical terminals and cables, but numerous electrical connectors have been designed with shielding that is effective against EMI/RFI energy. On the other hand, it often is desirable to have a shielded cable as well as shielded connectors.

A flat flexible circuit conventionally includes an elongated flat flexible dielectric substrate having laterally spaced strips of conductors on one or both sides thereof. The conductors may be covered with a thin, flexible protective layer on one or both sides of the circuit. If protective layers are used, cutouts are formed therein to expose the underlying conductors at desired contact locations where the conductors are to engage the conductors of a complementary mating connecting device which may be a second flat flexible circuit, a printed circuit board or the terminals of a mating connector.

A wide variety of connectors have been designed over the years for terminating or interconnecting flat flexible circuits with complementary mating connecting devices. However, there has not been a cost effective system for electrically connecting flat flexible circuitry which is shielded. For instance, if it is desired to shield the flat flexible circuitry, the signal conductors typically are disposed on one side of the substrate and a ground circuit is disposed on the opposite side of the substrate. At an early time, it was known to cover the opposite side of the substrate with a layer of metal such as copper for shielding and grounding purposes. However, it has been found that such metal layers significantly decrease the flexibility of the flexible circuitry. Consequently, a conductive wire mesh or grounding grid has been used on a side of the substrate, typically on the side opposite the signal conductors, for grounding and shielding purposes. The invention is directed to providing a simple, reliable and cost effective system for terminating a shielded flat flexible circuit and solving the problems of inefficient systems heretofore available. It should be understood that the invention is not limited to systems where the signal conductors and ground conductors (or grid) are disposed on opposite sides of the flat flexible circuit substrate. Both the signal conductors and the grounding conductors can be disposed on the same side of the substrate.

It should be noted that the invention can be used in related systems, such as with controlled impedance cable or other types of cable where high speed transmissions necessitate shielding and other electrical considerations.

SUMMARY OF THE INVENTION

An object, therefore, of the invention is to provide a new and improved connector system for terminating a shielded flat flexible circuit. In particular, the system electrically interconnects the signal conductors of a shielded flat flexible circuit to the conductors of a complementary mating connecting device, while grounding the ground conductors of the circuit.

In the exemplary embodiment of the invention, the system includes a connector body member for positioning the flat flexible circuit thereon. The body member is conductive and includes at least one projection extending away from the body member. A flat flexible circuit is positionable on the body member and includes a plurality of signal conductors and at least one grounding conductor. A hole is formed in the flexible circuit for receiving the projection of the body member in engagement with the grounding conductor and, thereby, to common the grounding conductor with the conductive connector body member.

As disclosed herein, the connector body member is a male body member about which the flat flexible circuit is wrapped, with the signal conductors facing away from the body member. A yieldable backing structure is provided on the body member beneath the flexible circuit for resiliently biasing the signal conductors outwardly. Therefore, the signal conductors can be biased against contacts, terminals or another flat circuit of the complementary mating connecting device. The yieldable backing structure preferably is a molded-in-place component of elastomeric material such as silicone rubber material or the like.

The flat flexible circuit includes a flexible insulating substrate, with the signal conductors disposed on at least one side of the substrate. The grounding conductor can be disposed either on an opposite side of the substrate or on the same side as the signal conductors, according to alternate embodiments of the invention. The grounding conductor also may comprise a grounding grid.

According to another aspect of the invention, the hole in the flat flexible circuit is generally round, and the cross-dimension of the projection on the body member is greater than the diameter of the hole. The difference between the cross-dimension of the projection and the diameter of the hole is on the order of 5% to 50% of the diameter of the hole.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 10 is plan view of the single-sided circuit.

DETAILED DESCRIPTION OF THE PREFERRED EMBODIMENTS

Figure 1:
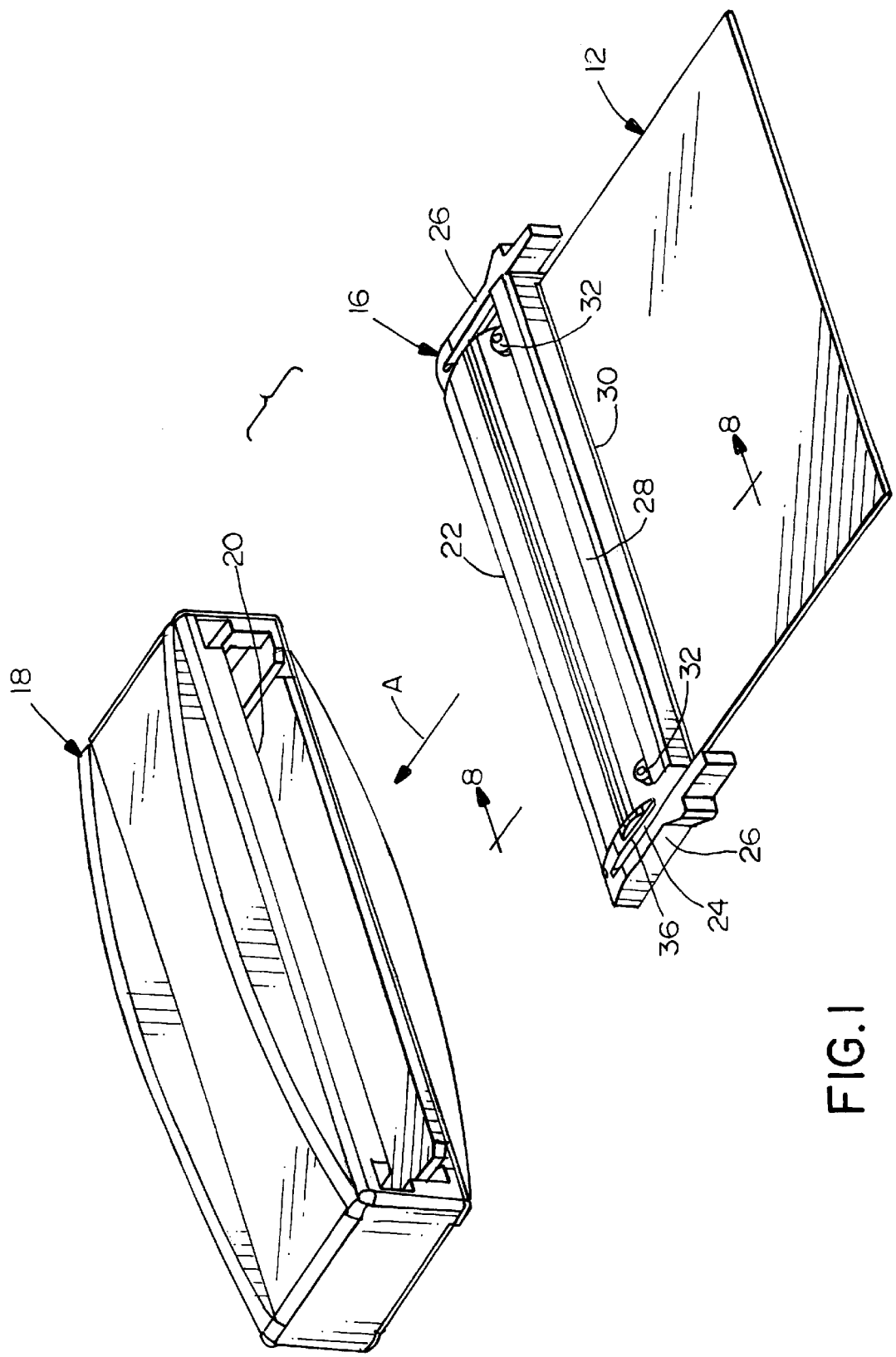
FIG. 1 is a perspective view of a connector system including a male connector for terminating a double-sided shielded flat flexible circuit, along with a female receptacle device.

Referring to the drawings in greater detail, FIGS. 1–8 are directed to a connector system for terminating a double-sided flat flexible circuit, generally designated 12. FIGS. 9 and 10 are directed to an alternate embodiment of the invention for terminating a single-sided flat flexible circuit, generally designated 14.

Turning first to FIG. 1, the system includes a male connector, generally designated 16, for insertion into a female connector, generally designated 18. It must be understood that the invention is not limited to use with male connectors. In addition, female connector 18 can be a wide variety of complementary mating connecting devices, including a power module. Suffice it to say herein, female connector 18 hereinafter will be referred to as the "receptacle device", and the device is fabricated of conductive material. The receptacle device includes a receptacle or opening 20 for receiving male connector 16 inserted thereinto in the direction of arrow "A". The male connector can be mated with the receptacle device by inserting a leading edge 22 of the male connector into opening 20 of the receptacle device.

Figure 2:
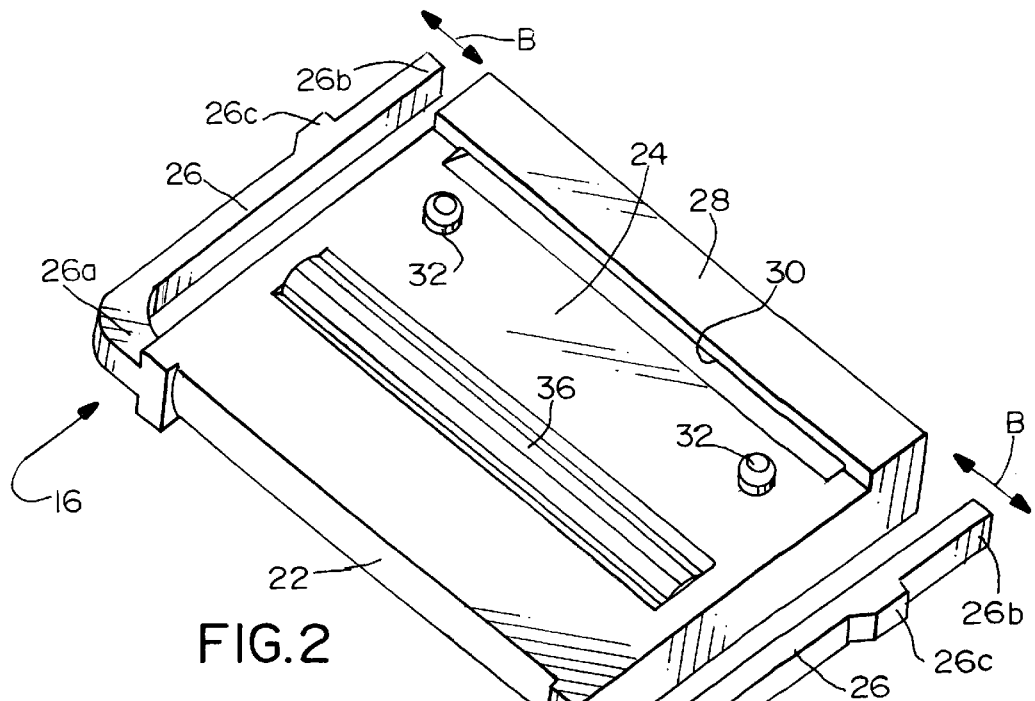
FIG. 2 is a top perspective view of the male connector, with the flexible circuit removed.
Figure 3:
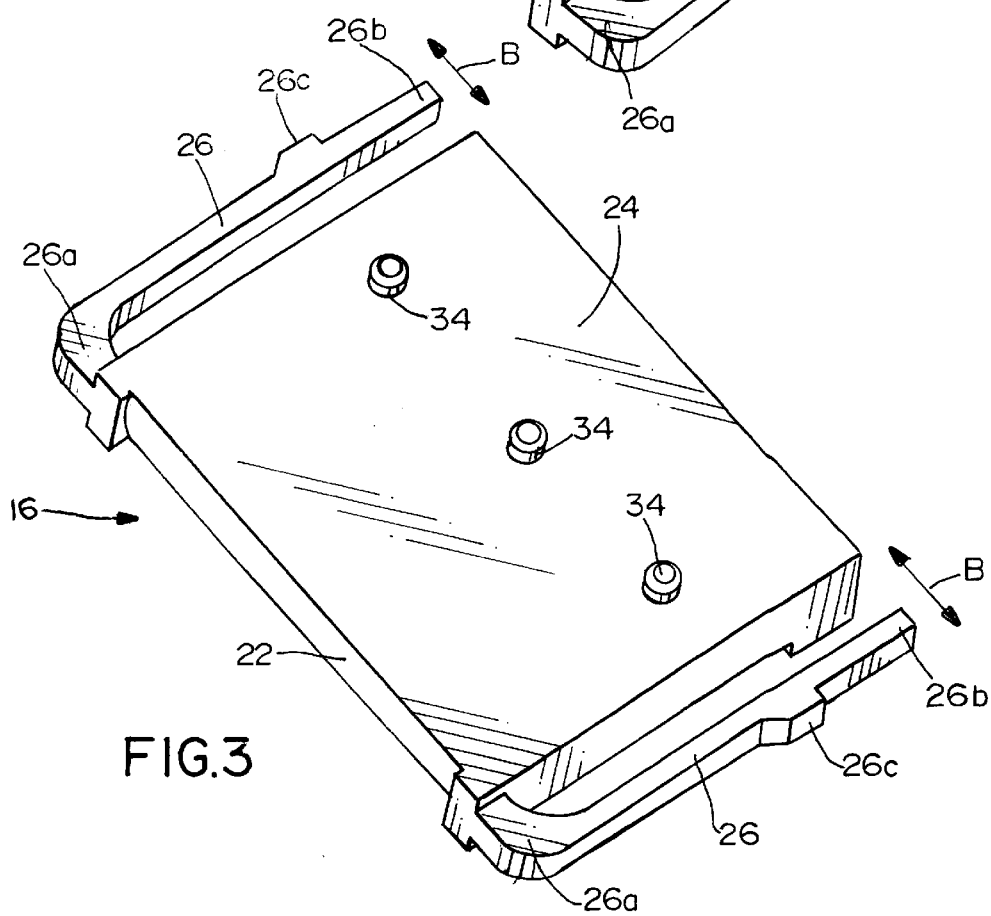
FIG. 3 is a bottom perspective view of the male connector.

Referring to FIGS. 2 and 3 in conjunction with FIG. 1, male connector 16 includes a male body member 24 about which flat flexible circuit 12 is wrapped around leading edge 22. The male body member is generally flat and elongated and includes a pair of cantilevered latch arms 26 at opposite ends thereof and integral therewith. At least the body member is fabricated of or coated with a conductive material and therefore is conductive for purposes of grounding, as discussed hereinafter. Cantilevered latch arms 26 are integrally joined to the body member at proximal ends 26a near leading edge 22 of the connector. Therefore, free ends 26b of the latch arms can flex in the direction of double-headed arrows "B". A pair of latch hooks 26c project outwardly of the latch arms for engagement with appropriate latch means on the complementary mating connecting device, such as within opening 20 of conductive receptacle device 18. Finally, a raised rib or flange 28 extends longitudinally along the top rear edge of body member 24 to define a slot 30 therebeneath and through which flat flexible circuit 12 extends, as best seen in FIG. 1.

Still referring to FIGS. 2 and 3 in conjunction with FIG. 1, a pair of laterally disposed locating pegs 32 project upwardly away from the top of body member 24 as seen in FIGS. 1 and 2. Three locating pegs 34 are aligned in a transverse row and project downwardly away from the body member as seen in FIG. 3. These locating pegs are used to mount flat flexible circuit 12 onto the body member about leading edge 22 of the male connector.

Finally, male connector 16 includes a molded-in-place resilient backing structure or rib 36 which is shown clearly in FIG. 2. The backing rib extends longitudinally of the width of body member 24 and engages the underside of flat flexible circuit 12 to bias the signal conductors of the circuit against the conductors of the complementary mating connecting device, as will be seen hereinafter. The resilient backing rib biases the signal conductors away from the male connector into engagement with the conductors, such as contacts, terminals or another flat circuit, of the complementary mating connecting device. For instance, the mating conductors might be disposed within opening 20 of receptacle device 18 (FIG. 1).

Figure 4:
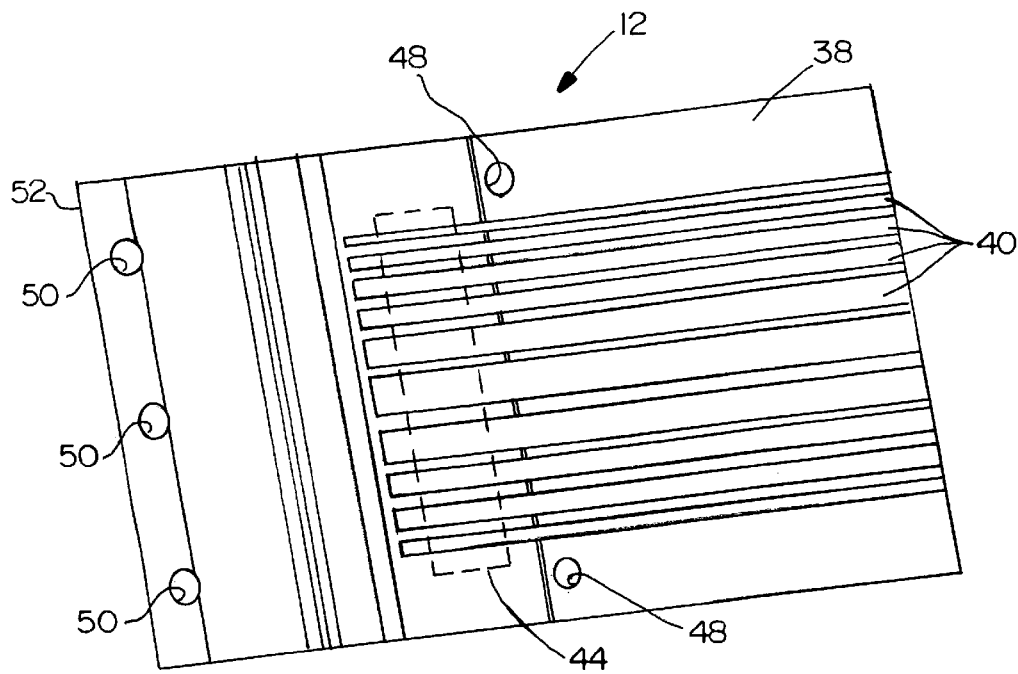
FIG. 4 is a plan view of the signal conductor side of the flat flexible circuit.
Figure 5:
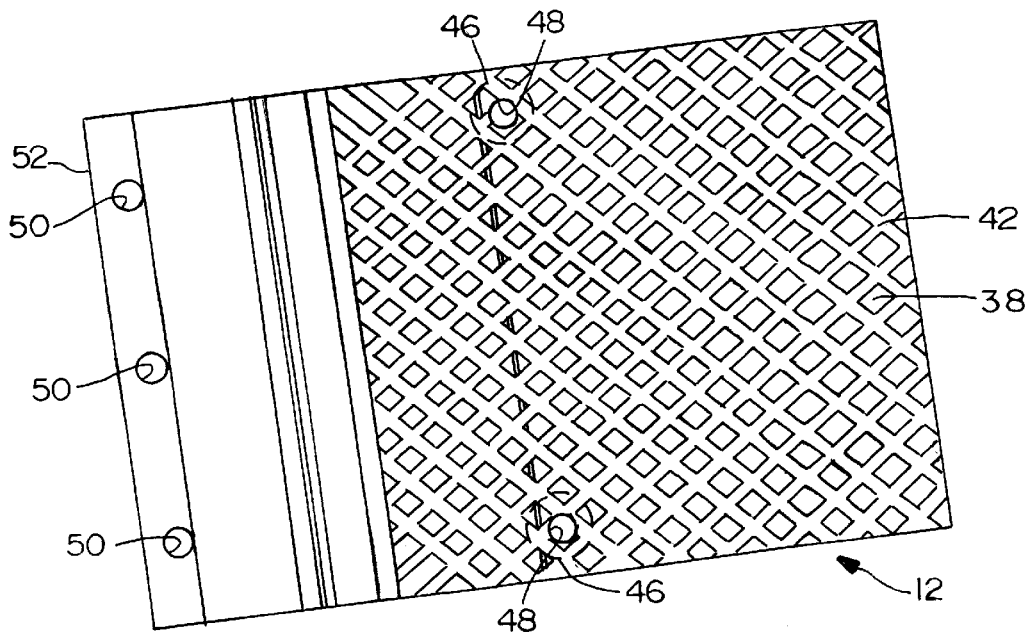
FIG. 5 is a plan view of the shielded or grounding conductor side of the flexible circuit.
Figure 6:
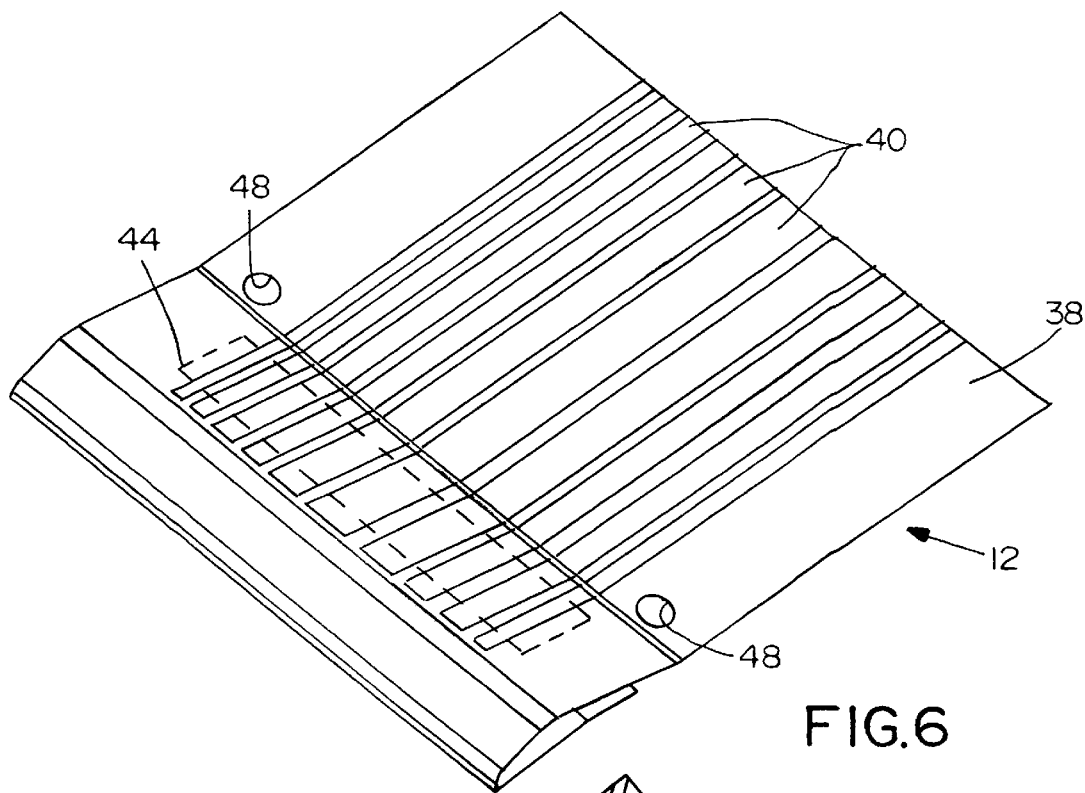
FIG. 6 is a perspective view of the signal conductor side of the circuit after being bent for wrapping about the male connector.
Figure 7:
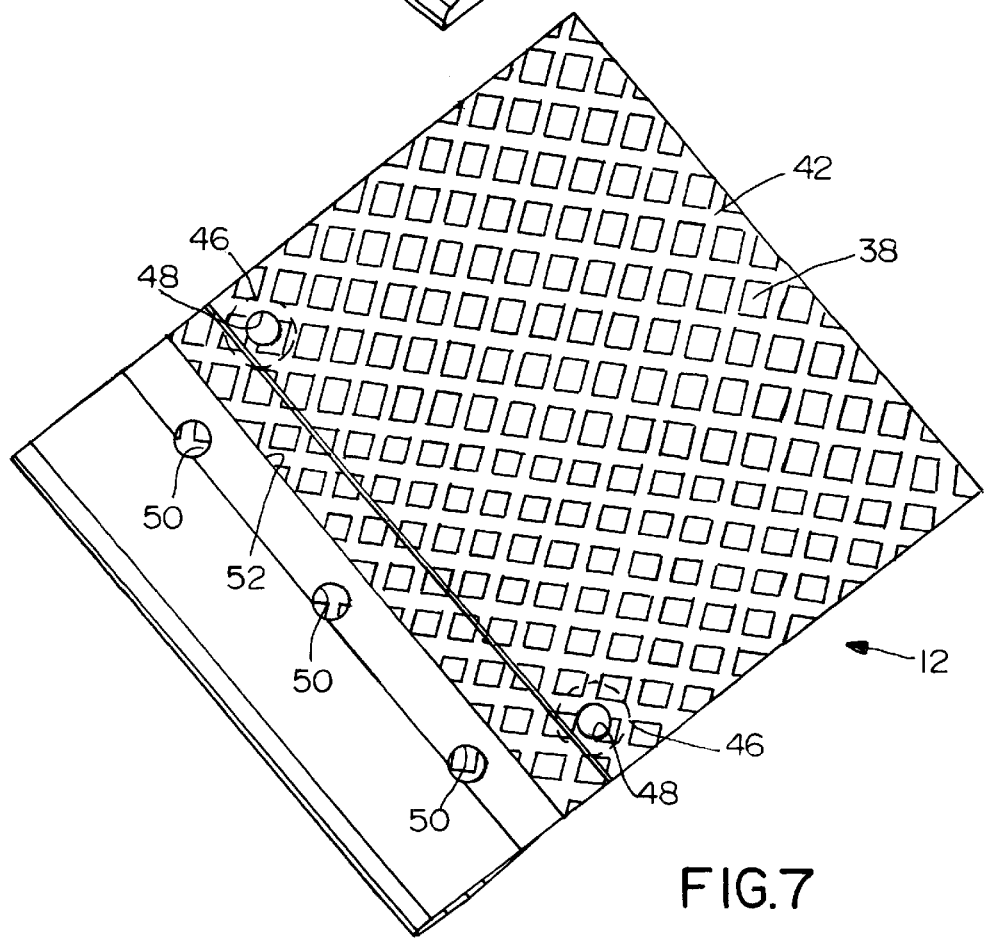
FIG. 7 is a perspective view of the grounding conductor side of the circuit after being bent for wrapping about the male connector.

The embodiment of the male connector 16 shown in FIGS. 1–3 and described above is adapted for terminating a "double-sided" flat flexible circuit 12 which is shown in FIGS. 4–7. The flat flexible circuit includes an elongated flat flexible dielectric substrate 38 having laterally spaced strips of signal conductors 40 on one side thereof as best seen in FIGS. 4 and 6. A grounding conductor (or conductors) is disposed on the opposite side of substrate 38 in the form of a grounding grid 42 as shown in FIGS. 5 and 7. The grounding grid is effective to provide a shielding means for the flat flexible circuit. Although not visible in the drawings because of its transparency, the signal conductors and the grounding grid are covered with a thin flexible projective layer of dielectric material. The film is cut-out at least in the area of rectangular dotted lines 44 (FIGS. 4 and 6) to expose signal conductors 40 along the top of yieldable backing rib 36 so that the conductors can be biased into engagement with the conductors of the complementary mating connecting device. Similarly, the dielectric film which covers grounding grid 42 is cut-out, at least in the areas indicated by dotted circles 46 (FIGS. 5 and 7), around a pair of locating holes 48. Finally, three locating holes 50 are formed through the circuit near a leading edge 52 thereof. FIGS. 4 and 5 show the flexible circuit in a flat condition, and FIGS. 6 and 7 show the circuit as it would be wrapped about leading edge 22 of body member 24 of male connector 16.

Figure 8:
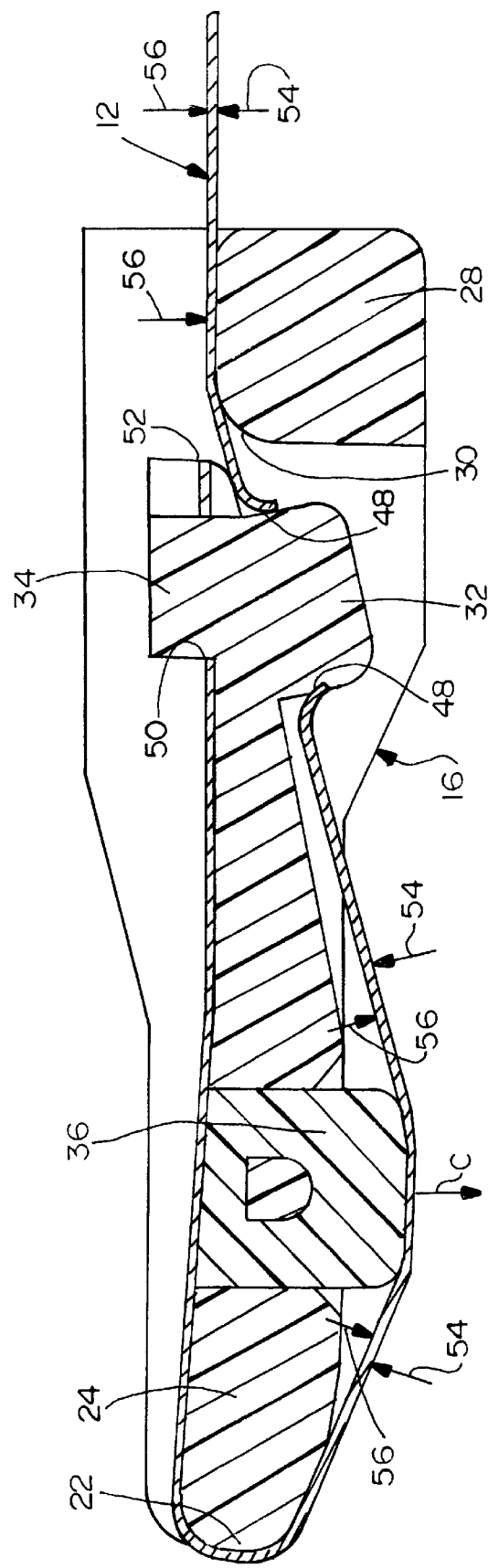
FIG. 8 is a vertical section, on an enlarged scale, taken generally along line 8—8 of FIG. 1.
Figure 9:
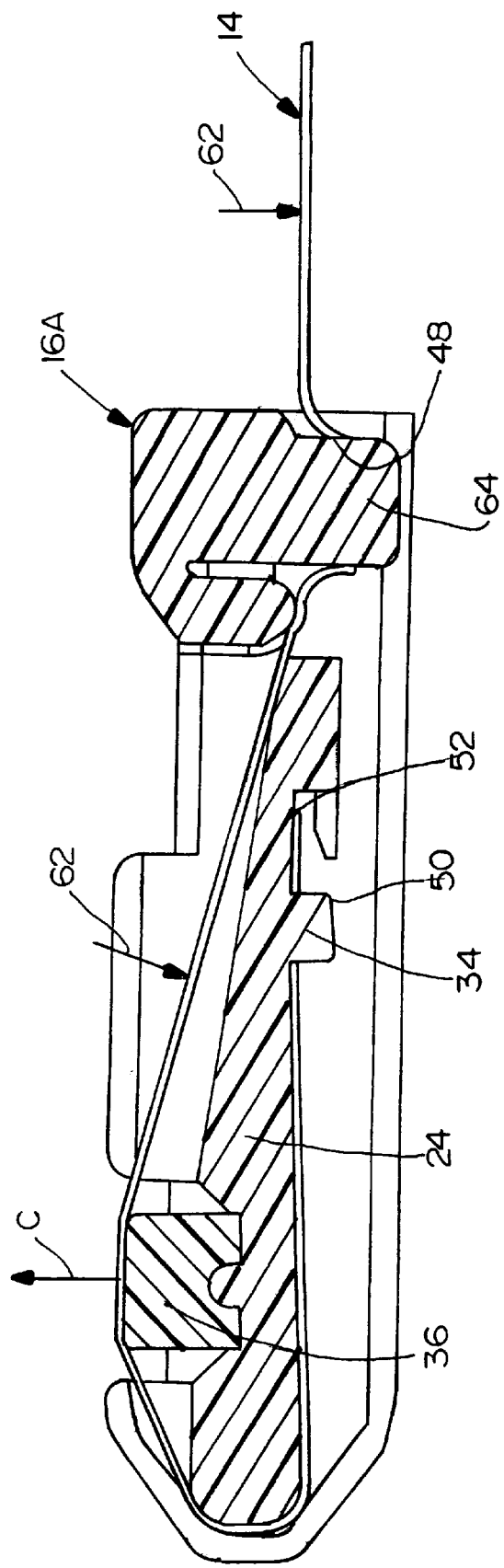
FIG. 9 is a view similar to that of FIG. 8, but of an alternate embodiment of the invention for terminating a single-sided flexible circuit.

FIG. 8 shows double-sided flat flexible circuit 12 threaded through slot 30 beneath flange 28 of male connector 16 as is seen in FIG. 1. For purposes of this depiction, arrows 54 indicate the signal conductor side (FIGS. 4 and 6) of the circuit, and arrows 56 indicate the shielded or grounding grid side (FIGS. 5 and 7) of the circuit. Therefore, when the circuit is mounted within male connector 16 and wrapped around leading edge 22 thereof, yieldable backing rib 36 is effective to bias the signal conductors away from body member 24 in the direction of arrow "C" (FIG. 8). Locating pegs 34 at the bottom of the male connector extend through locating holes 50 of the flexible circuit in an area where there are neither signal conductors nor grounding conductors. Therefore, locating pegs 34 are effective to anchor the leading edge of the flat flexible circuit.

With the dielectric film on the signal conductor side of the circuit being cut-out as at 44 (FIGS. 4 and 6), signal conductors 40 are exposed on top of yieldable backing rib 36 and face in the direction of arrow "C" (FIG. 8). However, the protective film prevents any other portions of the conductive male body member from engaging the signal conductors, as in the area indicated at 60 in FIG. 8. Similarly, the protective film on the grounding grid side of the circuit prevents grounding grid 42 from engaging any portions of the connector except within cutouts 46 (FIGS. 5 and 7) in the vicinity of locating pegs 32. More particularly, FIG. 8 shows one of the locating pegs 32 projecting through one of the locating holes 48 in the flat flexible circuit. These locating pegs form projections which are in engagement with grounding grid 42 within cutouts 46. Therefore, the grounding grid is commoned to conductive connector body member 24 which, in turn, can be used for engaging grounding or shielding means on whatever type of receptacle device with which the male connector is mated.

The invention contemplates the novel use of a principle which may be called a "controlled meniscus" in accordance with the teachings of U.S. Pat. No. 5,384,435, dated Jan. 25, 1995 and assigned to the assignee of the present invention. In other words, the substrate of flat flexible circuit 12 may be less than 0.050 inch thick, with each locating hole 48 being generally round and of a given diameter. The cross-dimensions of locating pegs 32 are greater than the diameters of round holes 48. The difference between the cross-dimensions of locating pegs 32 and the diameters of the round locating holes 48 is on the order of 5% to 50% of the diameters of the holes.

FIGS. 9 and 10 show an alternative embodiment of a male connector, generally designated 16A which includes a male body member 24 about which a "single-sided" flat flexible circuit 14 is wrapped. The single-sided circuit has what can be termed an "active side" as indicated by arrows 62 in FIG. 9.

More particularly, FIG. 10 shows the single-sided flat flexible circuit 14 to include signal conductors 40 and a pair of grounding grids 42 which only cover edge areas of substrate 38 outside the elongated signal conductors. Again, single-sided circuit 14 includes a pair of locating holes 48 which extend through grounding grids 42 and three locating holes 50 along the leading edge 52 of the circuit.

Referring back to FIG. 9, male connector 16A also includes a resilient backing rib 36 which biases signal conductors 40 away from male body member 24 in the direction of arrow "C". FIG. 9 also shows locating pegs 34 of the connector extending through locating holes 50 of the circuit.

The principal difference between connector 16A in FIG. 9 and connector 16 in FIG. 8 is that connector 16A has a pair of locating pegs 64 which project in a direction opposite locating pegs 32 of connector 16. This can be seen easily by comparing FIGS. 8 and 9. When locating pegs 64 project through locating holes 48 in grounding grids 42 (FIG. 10), locating pegs 64 are effective to common the grounding grids with the conductive connector body member. Again, locating pegs 64 and locating holes 48 are dimensioned to take advantage of the "controlled meniscus" principle.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A connector system for electrically interconnecting the conductors of a shielded flat flexible circuit to the conductors of a complementary mating connecting device, comprising a connector body member for positioning the flat flexible circuit thereon, the body member being conductive and including at least one projection; and a flat flexible circuit positionable on the body member and including a plurality of signal conductors and at least one grounding conductor, with a hole in the circuit for receiving said projection in engagement with the grounding conductor and to thereby common the grounding conductor with the conductive connector body member.

2. The connector system of claim 1 wherein said connector body member is a male body member about which the flat flexible circuit is wrapped with the signal conductors facing away from the body member.

3. The connector system of claim 1 wherein said flat flexible circuit includes a flexible insulating substrate with said signal conductors extending along at least one side of the substrate and said grounding conductor extending along an opposite side of the substrate.

4. The connector system of claim 3 wherein said grounding conductor comprises a grounding grid.

5. The connector system of claim 1 wherein the hole in said flat flexible circuit is generally round, the cross-dimension of said projection is greater than the diameter of the hole, and the difference between the cross-dimension of the projection and the diameter of the hole is on the order of 5% to 50% of the diameter of the hole.

6. The connector system of claim 1 wherein said flat flexible circuit is positionable on the body member with the signal conductors facing away from the body member, and including a yieldable backing structure on the body member beneath the flexible circuit for resiliently biasing the signal conductors outwardly.

7. The connector system of claim 6 wherein said yieldable backing structure is a molded-in-place component.

8. The connector system of claim 7 wherein said molded-in-place component is of an elastomeric material.

9. The connector system of claim 8 wherein said molded-in-place component is of silicone rubber material.

10. A connector system for electrically interconnecting the conductors of a shielded flat flexible circuit to the conductors of a complementary mating connecting device, comprising:

a connector body member for positioning the flat flexible circuit thereon, the body member being conductive and including at least one projection extending away from the body member; and a flat flexible circuit positionable on the body member and including a flat flexible insulating substrate, a plurality of signal conductors disposed on one side of the substrate facing away from the body member, at least one grounding conductor disposed on an opposite side of the substrate facing the body member, and a hole in the circuit for receiving said projection in engagement with the grounding conductor and to thereby common the grounding conductor with the conductive connector body member.

11. The connector system of claim 10 wherein said connector body member is a male body member about which the flat flexible circuit is wrapped with the signal conductors facing away from the body member.

12. The connector system of claim 10 wherein said grounding conductor comprises a grounding grid.

13. The connector system of claim 10 wherein the hole in said flat flexible circuit is generally round, the cross-dimension of said projection is greater than the diameter of the hole, and the difference between the cross-dimension of the projection and the diameter of the hole is on the order of 5% to 50% of the diameter of the hole.

14. The connector system of claim 10, including a yieldable backing structure on the body member beneath the flexible circuit for resiliently biasing the signal conductors outwardly.

15. The connector system of claim 14 wherein said yieldable backing structure is a molded-in-place component.

16. The connector system of claim 15 wherein said molded-in-place component is of an elastomeric material.

17. The connector system of claim 16 wherein said molded-in-place component is of silicone rubber material.

18. A connector system for electrically interconnecting the conductors of a shielded flat flexible circuit to the conductors of a complementary mating connecting device, comprising:

a connector body member for positioning the flat flexible circuit thereon, the body member being conductive;

a flat flexible circuit positionable on the body member and including a plurality of signal conductors and at least one grounding conductor all on the same side of the circuit, with the signal conductors facing away from the body member for engaging the conductors of the complementary mating connecting device, and a hole in the circuit in the vicinity of the grounding conductor; and a projection on the connector body member remote from the signal conductors for projecting through said hole and into engagement with the grounding conductor, to thereby common the grounding conductor and the conductive connector body member.

19. The connector system of claim 18 wherein said grounding conductor comprises a grounding grid.

20. The connector system of claim 18 wherein the hole in said flat flexible circuit is generally round, the cross-dimension of said projection is greater than the diameter of the hole, and the difference between the cross-dimension of the projection and the diameter of the hole is on the order of 5% to 50% of the diameter of the hole.

21. The connector system of claim 18, including a yieldable backing structure on the body member beneath the flexible circuit for resiliently biasing the signal conductors outwardly.

22. The connector system of claim 21 wherein said yieldable backing structure is a molded-in-place component.

23. The connector system of claim 22 wherein said molded-in-place component is of an elastomeric material.

24. The connector system of claim 23 wherein said molded-in-place component is of silicone rubber material.

* * * * *